(12) United States Patent
Huang (10) Patent No.: US 11,061,064 B2
(45) Date of Patent: Jul. 13, 2021

(54) SEMICONDUCTOR DEVICE AND METHOD FOR DETECTING CRACKS

(71) Applicant: NANYA TECHNOLOGY CORPORATION, New Taipei (TW)

(72) Inventor: Chih-Wei Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 201 days.

(21) Appl. No.: 16/412,983

(22) Filed: May 15, 2019

(65) Prior Publication Data

US 2020/0363464 A1  Nov. 19, 2020

(51) Int. Cl.
*G01R 31/26* (2020.01)
*H01L 21/66* (2006.01)
*H01L 23/535* (2006.01)
*H01L 29/78* (2006.01)

(52) U.S. Cl.
CPC ..... *G01R 31/2644* (2013.01); *G01R 31/2601* (2013.01); *H01L 22/32* (2013.01); *H01L 23/535* (2013.01); *H01L 29/78* (2013.01)

(58) Field of Classification Search
CPC .......................... G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 8,383,994 B2* | 2/2013 | Rashid | B32B 17/10009 219/507 |
| 2004/0163478 A1* | 8/2004 | Xu | G01N 29/2475 73/763 |
| 2006/0152380 A1* | 7/2006 | Anderson | G01L 27/007 340/679 |
| 2019/0033365 A1 | 1/2019 | Sanchez et al. | |

FOREIGN PATENT DOCUMENTS

| | | |
|---|---|---|
| TW | 417291 | 1/2001 |
| TW | 417291 B | 1/2001 |
| TW | 201436046 A | 9/2014 |
| TW | 201436046 A | 9/2014 |
| WO | 2013152535 A1 | 10/2013 |
| WO | WO-2013/152535 A1 | 10/2013 |

OTHER PUBLICATIONS

Office Action dated Oct. 23, 2020 related to Taiwanese Application No. 108127018.
Office Action dated Mar. 23, 2021 in TW Application No. 108127018, 4 pages.

\* cited by examiner

*Primary Examiner* — Tung X Nguyen
(74) *Attorney, Agent, or Firm* — Muncy, Geissler, Olds & Lowe, P.C.

(57) ABSTRACT

A semiconductor device and a method for detecting cracks are provided. The semiconductor device includes a first conductive layer, a second conductive layer positioned above the first conductive layer, an isolation layer positioned between the first conductive layer and the second conductive (Continued)

layer, and a transistor electrically coupled to the first conductive layer. The first conductive layer, the second conductive layer, the insulating layer, and the transistor together form a crack detecting structure.

18 Claims, 5 Drawing Sheets

SEMICONDUCTOR DEVICE AND METHOD FOR DETECTING CRACKS

TECHNICAL FIELD

The present disclosure relates to a semiconductor device, and more particularly, to a semiconductor device with crack detecting structure. The present disclosure also relates to a method for detecting cracks in a semiconductor device.

DISCUSSION OF THE BACKGROUND

Semiconductor devices are used in a variety of electronic applications, such as personal computers, cell phones, digital cameras, and other electronic equipment. During the production and/or the operation of the semiconductor devices, cracks can occur and propagate in the semiconductor device. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first conductive layer, a second conductive layer positioned above the first conductive layer, an isolation layer positioned between the first conductive layer and the second conductive layer, and a transistor electrically coupled to the first conductive layer. The first conductive layer, the second conductive layer, the isolation layer, and the transistor together form a crack detecting structure.

Another aspect of the present disclosure provides a semiconductor device including a substrate, an insulating layer positioned above the substrate and having two ends, a first doped region formed in the substrate and positioned at the end of the insulating layer, a second doped region formed in the substrate and positioned at the other end of the insulating layer and opposite to the first doped region, a control structure positioned above the insulating layer, a first conductive layer positioned above the control structure and electrically coupled to the first doped region, a second conductive layer positioned above the first conductive layer, and an isolation layer positioned between the first conductive layer and the second conductive layer.

Another aspect of the present disclosure provides a semiconductor device including a substrate, an insulating layer positioned above the substrate and having two ends, a first doped region formed in the substrate and positioned at one end of the two ends of the insulating layer, a second doped region formed in the substrate and positioned at the other end of the two ends of the insulating layer and opposite to the first doped region, a control structure positioned above the insulating layer, a first conductive layer positioned above the control structure and electrically coupled to the control structure, a second conductive layer positioned above the first conductive layer, and an isolation layer positioned between the first conductive layer and the second conductive layer.

Another aspect of the present disclosure provides a method for detecting cracks including providing a semiconductor device, coupling a test circuitry and a control circuitry to the semiconductor device, applying a predetermined voltage from the test circuitry and a gate voltage from the control circuitry to the semiconductor device and measuring a signal from the test circuitry. The semiconductor device comprises a first conductive layer, a second conductive layer positioned above the first conductive layer, an isolation layer positioned between the first conductive layer and the second conductive layer, and a transistor electrically coupled to the first conductive layer. The first conductive layer, the second conductive layer, the isolation layer, and the transistor together form a crack detecting structure.

Due to the design of the semiconductor device, it is possible to detect cracks electrically, and the efficiency of manufacturing the semiconductor device may be thereby improved. In addition, the electrical crack-detecting capacity of the semiconductor device may also be used to detect latent damage which is difficult to detect by visual inspection.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor device with crack detecting structure and a method for detecting cracks in a semiconductor device. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure are described in detail below. However, in addition to the detailed description, the present disclosure may also be widely implemented in other embodiments. The scope of the present disclosure is not limited to the detailed description, but is defined by the claims.

Note that, in the description of the present disclosure, above (or up) corresponds to the direction of the arrow of the direction Z, and below (or down) corresponds to the opposite direction of the arrow of the direction Z.

One issue of manufacturing semiconductor device is the presence of cracks. Cracks can take a variety of structures, including fissures, fractures and other dislocations, and some cracks formed in the semiconductor device may be difficult to detect by usual visual inspection. In addition, cracks may propagate or enlarge during the manufacture of the semiconductor device or during operation by the user and can eventually cause failure of the semiconductor device.

Figure 1A:
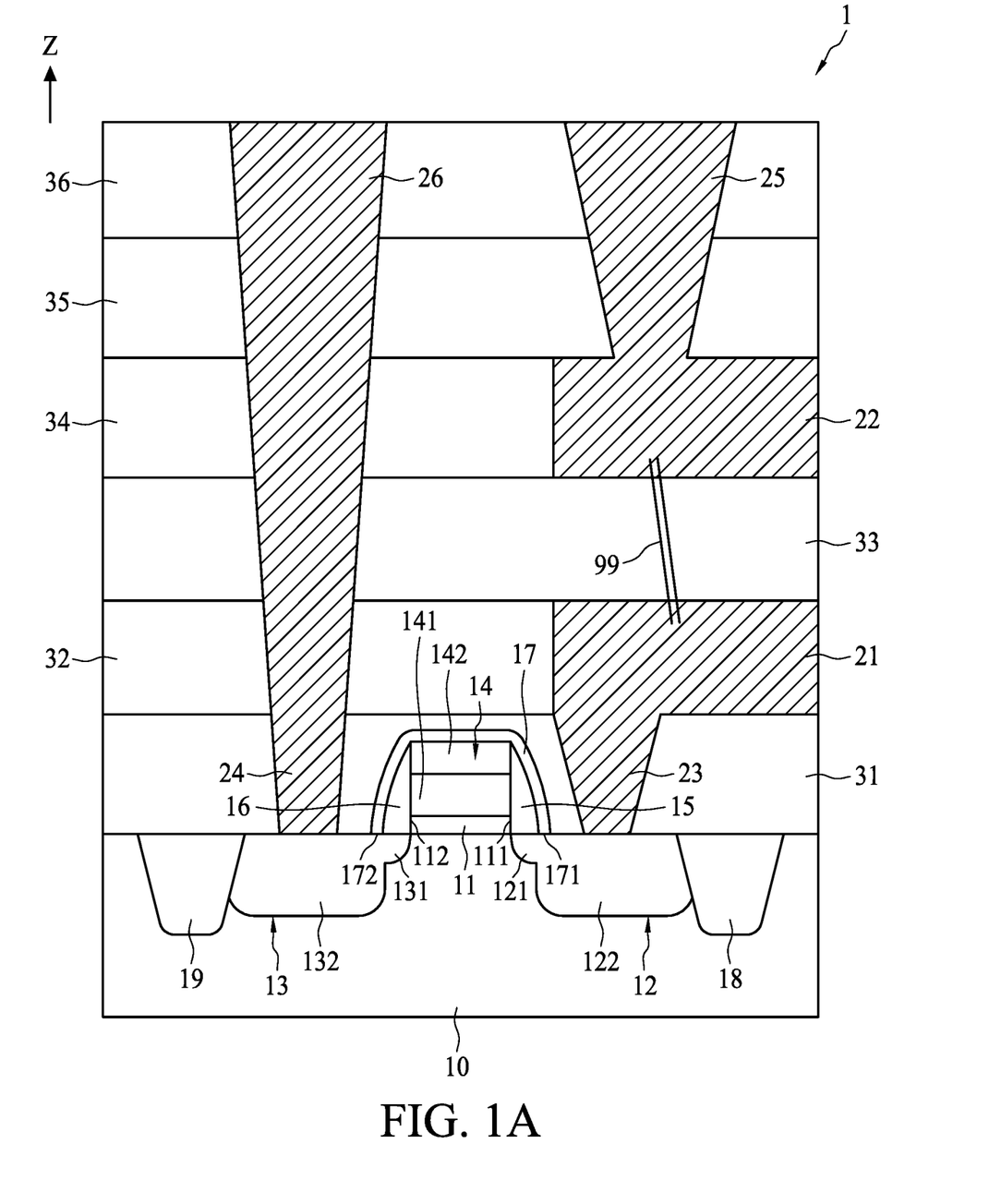
FIG. 1A to FIG. 1C illustrate, in schematic cross-sectional view and circuit diagram form, a semiconductor device in accordance with an embodiment of the present disclosure.

FIG. 1A illustrates, in schematic cross-sectional view, an exemplary semiconductor device in accordance with an embodiment of the present disclosure. The semiconductor device 1 includes, for example, a substrate 10, an insulating layer 11, a doped region 12, a doped region 13, a control structure 14, a spacer 15, a spacer 16, a mask layer 17, an isolation structure 18, an isolation structure 19, a conductive layer 21, a conductive layer 22, a connecting plug 23, a connecting plug 24, a terminal 25, a terminal 26, an isolation layer 31, an isolation layer 32, an isolation layer 33, an isolation layer 34, an isolation layer 35, and a seal layer 36.

The substrate 10 is formed of, for example, silicon (Si), doped silicon, silicon on insulator (SOI), silicon on sapphire (SOS), silicon germanium on insulator (SGOI), silicon carbide (SiC), germanium (Ge), gallium arsenide (GaAs), gallium phosphide (GaP), indium phosphide (InP) or any other IV-IV, III-V or II-VI semiconductor material. In the embodiment depicted, the substrate 10 is formed of p-type silicon, which is suitable for an n-type metal-oxide-semiconductor field-effect transistor (MOSFET). Alternatively, in another embodiment, the substrate 10 is formed of n-type silicon, for example.

The insulating layer 11 is disposed above the substrate 10. In the embodiment depicted, the insulating layer 11 is disposed on the substrate 10. The insulating layer 11 is formed of, for example, silicon oxide, silicon-oxy-nitride (SiON), barium strontium titanate (BST), lead zirconium titanate (PZT), titanium oxide (TiO$_2$), aluminum oxide (Al$_2$O$_3$), hafnium oxide (HfO$_2$), or zirconium oxide (ZrO$_2$). In the embodiment depicted, the insulating layer 11 is formed of silicon oxide. The insulating layer 11 includes two ends 111, 112. Alternatively, in another embodiment, the insulating layer 11 is formed of hafnium oxide, for example.

Note that the doped regions 12, 13 may be referred to as a first doped region and a second doped region. This includes embodiments where the doped region 12 is referred to as the first doped region and the doped region 13 is referred to as the second doped region, or vice versa.

The doped regions 12, 13 are formed in the substrate 10, respectively. In the embodiment depicted, the doped regions 12, 13 are respectively formed in the substrate 10 and are correspondingly adjacent to each end 111, 112 of the insulating layer 11. The doped region 12 is apart from the doped region 13 with the insulating layer 11 interposed therebetween.

The doped regions 12, 13 are doped by, for example, a dopant that is different from the substrate 10. In the embodiment depicted, the doped regions 12, 13 are doped by phosphorus (P). Alternatively, in another embodiment, the doped regions 12, 13 are doped by boron (B), for example.

The doped region 12 includes a lightly doped area 121 and a heavily doped area 122. The doped region 13 includes a lightly doped area 131 and a heavily doped area 132. The lightly doped areas 121, 131 of the doped regions 12, 13 are respectively formed in the substrate 10 and are correspondingly adjacent to each end 111, 112 of the insulating layer 11. The heavily doped area 122 of the doped region 12 is formed in the substrate 10 and is adjacent to the lightly doped area 121 of the doped region 12. The heavily doped area 132 of the doped region 13 is formed in the substrate 10 and is adjacent to the lightly doped area 131 of the doped region 13. The heavily doped areas 122, 132 of the doped regions 12, 13 respectively have a dopant concentration that is greater than a dopant concentration of the lightly doped areas 121, 131 of the doped regions 12, 13. In the embodiment depicted, the dopant concentration of the lightly doped areas 121, 131 of the doped regions 12, 13 is about $10^{13}/cm^2$ and the dopant concentration of the heavily doped areas 122, 132 of the doped regions 12, 13 is about $10^{15}/cm^2$. The lightly doped areas 121, 131 of the doped regions 12, 13 may alleviate the hot electron effect.

The control structure 14 is disposed above the insulating layer 11. In the embodiment depicted, the control structure 14 is disposed on the insulating layer 11 and is opposite to the substrate 10. The control structure 14 is not opposite to the doped regions 12, 13. The control structure 14 includes a doped layer 141 and a metal layer 142. The doped layer 141 is disposed on the insulating layer 11. The metal layer 142 is disposed on the doped layer 141 and is opposite to the insulating layer 11 with the doped layer 141 interposed therebetween.

The doped layer 141 is formed of, for example, polysilicon. In the embodiment depicted, the doped layer 141 is formed of polysilicon doped with phosphorus. The metal layer 142 is formed of, for example, metal silicide such as nickel silicide, platinum silicide, titanium silicide, molybdenum silicide, cobalt silicide, tantalum silicide, or tungsten silicide. In the embodiment depicted, the metal layer 142 is formed of tungsten silicide. Alternatively, in another embodiment, the doped layer 141 is formed of titanium nitride (TiN) and the metal layer 142 is formed of tantalum nitride (TaN), for example.

Note that the spacers 15, 16 may be referred to as a first spacer and second spacer. This includes embodiments in which the spacer 15 is referred to as the first spacer and the spacer 16 is referred to as the second spacer, or vice versa.

The spacers 15, 16 are respectively attached to side walls of the control structure 14. The spacer 15 is opposite to the spacer 16 with the control structure 14 interposed therebetween. Bottom surfaces of the spacers 15, 16 respectively contact the lightly doped areas 121, 131 of the doped regions 12, 13.

The spacers 15, 16 are formed of, for example, an insulating material such as silicon oxide or silicon nitride. In the embodiment depicted, the spacers 15, 16 are formed of silicon oxide. The spacers 15, 16 can be used to isolate the control structure 14 and the doped regions 12, 13.

The mask layer 17 is disposed above the control structure 14. In the embodiment depicted, the mask layer 17 is disposed on the metal layer 142 and the spacers 15, 16 and is opposite to the doped layer 141. The mask layer 17 covers the spacers 15, 16 and the control structure 14. The mask layer 17 includes two ends 171, 172. The ends 171, 172 of the mask layer 17 respectively contact the doped regions 12, 13.

The mask layer 17 is formed of, for example, an insulating material such as silicon oxide or silicon nitride. In the embodiment depicted, the mask layer 17 is formed of silicon nitride.

The substrate 10, the insulating layer 11, the doped regions 12, 13, and the control structure 14 together form an n-type MOSFET. The doped regions 12, 13 serve as a source and a drain of the n-type MOSFET, respectively. In the embodiment depicted, the doped region 13 serves as the source of the n-type MOSFET and the doped region 12 serves as the drain of the n-type MOSFET. The control structure 14 serves as a gate of the n-type MOSFET. When a positive voltage is applied to the control structure 14 (gate), a channel forms in the substrate 10 and free electrons in the doped region 13 (source) can pass through the substrate 10 by the channel to the doped region 12 (drain) to form a current while a voltage difference is present between the doped regions 12, 13. When the applied voltage is zero, no channel is formed in the substrate 10; hence, no current will form between the doped regions 12, 13. Accordingly, the control structure 14 can serve as a switch to control the operation mode (on/off) of the n-type MOSFET by controlling the applied voltage. Alternatively, the n-type MOSFET may be part of a complementary metal-oxide-semiconductor field-effect transistor (CMOSFET).

Note that the isolation structures 18, 19 may be referred to as a first isolation structure and a second isolation structure. This includes embodiments in which the isolation structure 18 is referred to as the first isolation structure and the isolation structure 19 is referred to as the second isolation structure, or vice versa.

The isolation structures 18, 19 are respectively adjacent to the doped regions 12, 13. In the embodiment depicted, the isolation structures 18, 19 are respectively adjacent to the heavily doped areas 122, 132 of the doped regions 12, 13. The isolation structures 18, 19 are respectively opposite to the lightly doped areas 121, 131 of the doped regions 12, 13.

The isolation structures 18, 19 are formed of, for example, an insulating material such as silicon oxide or silicon nitride. In the embodiment depicted, the isolation structures 18, 19 are formed of silicon oxide.

Note that the conductive layers 21, 22 may be referred to as a first conductive layer and a second conductive layer. This includes embodiments in which the conductive layer 21 is referred to as the first conductive layer and the conductive layer 22 is referred to as the second conductive layer, or vice versa. Furthermore, the connecting plugs 23, 24 may be referred to as a first connecting plug and a second connecting plug. This includes embodiments in which the connecting plug 23 is referred to as the first connecting plug and the connecting plug 24 is referred to as the second connecting plug, or vice versa.

The conductive layer 21 is disposed above the substrate 10 and electrically coupled to the n-type MOSFET. In the embodiment depicted, the conductive layer 21 is disposed above the substrate 10. Specifically, the conductive layer 21 is disposed on the isolation layer 31 and is electrically coupled to the doped region 12. The conductive layer 21 is electrically coupled to the heavily doped area 122 of the doped region 12 by the connecting plug 23. In the embodiment depicted, the connecting plug 23 penetrates the isolation layer 31 and connects the conductive layer 21 to the doped region 12.

The conductive layer 21 is formed of, for example, a metal or alloy with good conductivity such as aluminum-silicon-copper alloy (Al—Si—Cu Alloy), aluminum (Al), gold (Au), silver (Ag), nickel (Ni), tungsten (W), or copper (Cu). In the embodiment depicted, the conductive layer 21 is formed of copper. However, selections of materials can be made as appropriate depending on requirements and are not particularly constrained.

The connecting plug 24 is coupled to the doped region 13. The connecting plug 24 is disposed on the substrate 10. In the embodiment depicted, the connecting plug 24 is coupled to the heavily doped area 132 of the doped region 13. The connecting plugs 23, 24 are formed of, for example, tungsten, copper, or aluminum. In the embodiment depicted, the connecting plugs 23, 24 are formed of tungsten.

Note that the isolation layers 31, 32, 33, 34, 35 may be referred to as the first isolation layer, the second isolation layer, the third isolation layer, etc. This includes embodiments in which the isolation layer 31 is referred to as the first isolation layer, the isolation layer 32 is referred to as the second isolation layer, and the isolation layer 33 is referred to as the third isolation layer, and so on, for example.

The isolation layer 31 is disposed above the substrate 10. In the embodiment depicted, the isolation layer 31 is disposed on the substrate 10 and encloses the mask layer 17 and the connecting plugs 23, 24. The isolation layer 31 is formed of, for example, phosphosilicate glass (PSG), borosilicate glass (BSG), borophosphosilicate glass (BPSG), or fluorinated silicate glass (FSG). In the embodiment depicted, the isolation layer 31 is formed of borophosphosilicate glass.

The isolation layer 32 is disposed above the substrate 10 and above the isolation layer 31. In the embodiment depicted, the isolation layer 32 is disposed on the isolation layer 31. The isolation layer 32 is disposed at the same level as the conductive layer 21 and encloses the conductive layer 21.

The isolation layer 33 is disposed above the substrate 10 and above the conductive layer 21. In the embodiment depicted, the isolation layer 33 is disposed on the conductive layer 21 and the isolation layer 32.

The conductive layer 22 is disposed above the substrate 10 and above the isolation layer 33 and at least partially overlaps the conductive layer 21. In the embodiment depicted, the conductive layer 22 is disposed on the isolation layer 33 and at least substantially overlaps the conductive layer 21. The conductive layer 21, the conductive layer 22, and the isolation layer 33 interposed therebetween together form a capacitor structure. Alternatively, in another embodiment, the configured capacitor structure is electrically coupled to a fin field-effect transistor, for example.

The conductive layer 22 can be formed of the same material as the conductive layer 21, but is not limited thereto. The conductive layer 22 is formed of, for example, a metal or alloy with good conductivity such as aluminum-silicon-copper alloy, aluminum, gold, silver, nickel, tungsten, or copper. In the embodiment depicted, the conductive layer 22 is formed of copper.

The isolation layer 34 is disposed above the substrate 10 and above the isolation layer 33. In the embodiment depicted, the isolation layer 34 is disposed on the isolation layer 33. The isolation layer 34 is disposed at the same level as the conductive layer 22 and encloses the conductive layer 22.

The isolation layer 35 is disposed above the substrate 10 and above the isolation layer 34. In the embodiment depicted, the isolation layer 35 is disposed on the isolation layer 34 and the conductive layer 22.

The isolation layers 32, 33, 34, 35 can be formed of, for example, the same material, but it are not limited thereto. The isolation layers 32, 33, 34, 35 are formed of, for example, a dielectric material such as silicon oxide, silicon nitride, fluorinated silicate glass, or porous silicon oxide. In the embodiment depicted, the isolation layers 32, 33, 34, 35 are formed of silicon oxide. Alternatively, in another embodiment, the isolation layer 33 is formed of dielectric material such as silicon-oxy-nitride, barium strontium titanate, lead zirconium titanate, titanium oxide, aluminum oxide, hafnium oxide, or zirconium oxide, for example. The capacitor structure having the isolation layer 33 formed of the aforementioned dielectric material may have a high capacitance.

The seal layer 36 is disposed above the substrate 10 and above the conductive layer 22. In the embodiment depicted, the seal layer 36 is disposed on the isolation layer 35. The seal layer 36 is formed of, for example, silicon oxide or silicon nitride. In the embodiment depicted, the seal layer 36 is formed of silicon nitride. The seal layer 36 preferably exerts a high vapor barrier in order to prevent moisture from entering from above.

Note that the terminals 25, 26 may be referred to as a first terminal and a second terminal. This includes embodiments in which the terminal 25 is referred to as the first terminal and the terminal 26 is referred to as the second terminal, or vice versa.

The terminal 25 is electrically connected to the conductive layer 22. In the embodiment depicted, the terminal 25 is formed to pass through the seal layer 36 and the isolation layer 35. The terminal 26 is electrically connected to the connecting plug 24. In the embodiment depicted, the terminal 26 is formed to pass through the seal layer 36 and the isolation layers 35, 34, 33, 32.

The terminals 25, 26 can be formed of the same material, but are not limited thereto. The terminals 25, 26 are formed of, for example, copper or aluminum. In the embodiment depicted, the terminals 25, 26 are formed of copper. The terminals 25, 26 can be connected to an external circuit for electrical readout and testing of the presence of cracks in the semiconductor device 1.

A plurality of barrier layers (not shown) are respectively disposed between the isolation layer 12 and the connecting plug 23, between the isolation layer 31 and the connecting plug 24, between the isolation layer 31 and the conductive layer 21, between the isolation layer 31 and isolation layer 32, between the isolation layer 32 and the conductive layer 21, between the isolation layer 32 and the terminal 26, between the isolation layer 32 and the isolation layer 33, between the isolation layer 33 and the terminal 26, between the isolation layer 33 and the conductive layer 22, between the isolation layer 33 and the isolation layer 34, between the isolation layer 34 and the conductive layer 22, between the isolation layer 34 and the terminal 26, between the isolation layer 34 and the isolation layer 35, between the isolation layer 35 and the conductive layer 22, between the isolation layer 35 and the terminal 25, between the isolation layer 35 and the terminal 26, and between the isolation layer 35 and the seal layer 36.

The plurality of barrier layers are formed of, for example, silicon nitride, titanium nitride, titanium-tungsten alloy, or tantalum nitride. In the embodiment depicted, the plurality of barrier layers are formed of silicon nitride. The plurality of barrier layers can improve the adhesion between aforementioned layers.

Figure 1B:
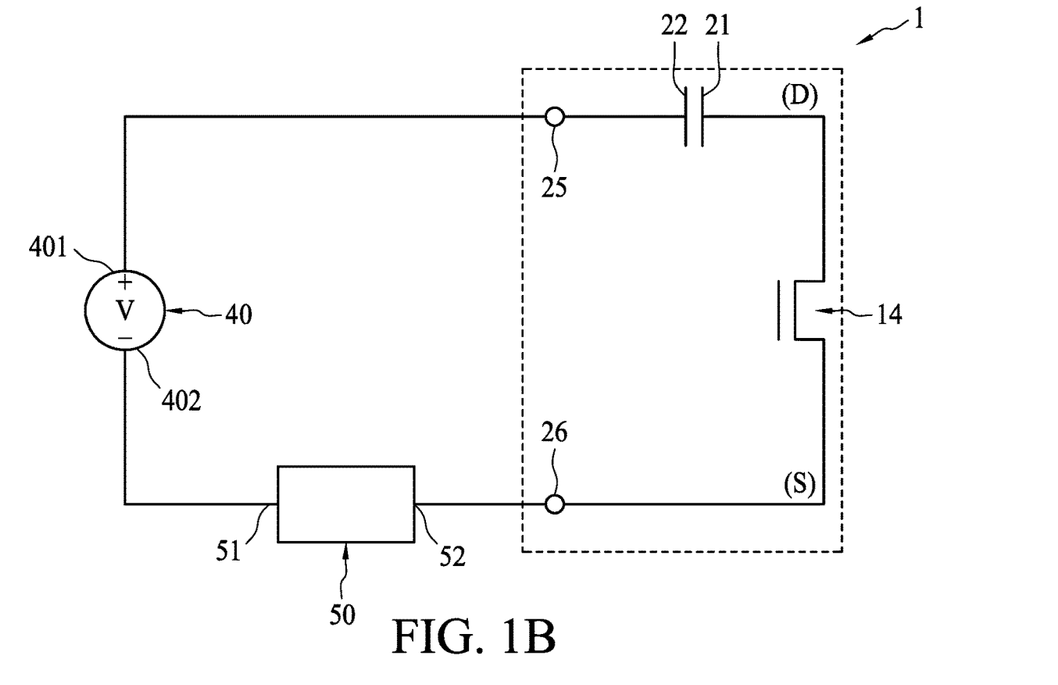

FIG. 1B illustrates, in schematic circuit diagram form, an exemplary crack detecting circuit in accordance with the embodiment depicted. The crack detecting circuit includes a test circuitry, a control circuitry and the semiconductor device 1. The test circuitry is electrically connected to the semiconductor device 1 through the terminals 25, 26 of the semiconductor device 1. The test circuitry includes a voltage source 40 and a signal detector 50. The signal detector 50 is, for example, a current detector or an impedance detector. In the embodiment depicted, the signal detector 50 is a current detector. The (+) terminal 401 of the voltage source 40 is electrically connected to the terminal 25, and the (−) terminal 402 of the voltage source 40 is electrically connected to a first terminal 51 of the signal detector 50. A second terminal 52 of the signal detector 50 is electrically connected to the terminal 26. The voltage source 40 can provide a predetermined voltage to the semiconductor device 1, wherein the predetermined voltage is less than the breakdown voltage of the capacitor structure of the semiconductor device 1. The control circuitry (not shown) is electrically connected to the metal layer 142 of the control structure 14.

The control circuitry (not shown) includes a voltage source to provide a gate voltage to control the operation mode of the n-type MOSFET of the semiconductor device 1. When the provided gate voltage is positive, the channel between the doped regions 12, 13, or drain and source, is formed. The channel forms between the doped regions 12, 13, which means the n-type MOSFET is in On mode for detecting cracks in the semiconductor device 1.

When the provided gate voltage is positive and the predetermined voltage of the voltage source 40 is applied, if there is a crack 99 present in the semiconductor device 1, the capacitor structure in the semiconductor device 1 will form a leakage current due to the presence of the crack 99 and the leakage current can be measured by the signal detector 50. In contrast, if no crack is present in the semiconductor device 1, no current will form due to the resistance of the capacitor structure of the semiconductor device 1.

However; when the provided gate voltage is zero or negative, no channel will form in the substrate 10 of the semiconductor device 1, and the n-type MOSFET is in Off mode, and therefore not capable of detecting cracks. The semiconductor device 1 can control the crack detecting feature by controlling the provided gate voltage.

In another embodiment, for example, the voltage source 40 of the test circuitry and the voltage source of the control circuitry may be the same voltage source. Therefore, it is possible to control the operation mode of the semiconductor device 1 and provide the predetermined voltage at the same time. In another embodiment, for example, a ground voltage may apply to the (−) terminal 402 of the voltage source 40 and the first terminal 51 of the signal detector 50.

Figure 1C:
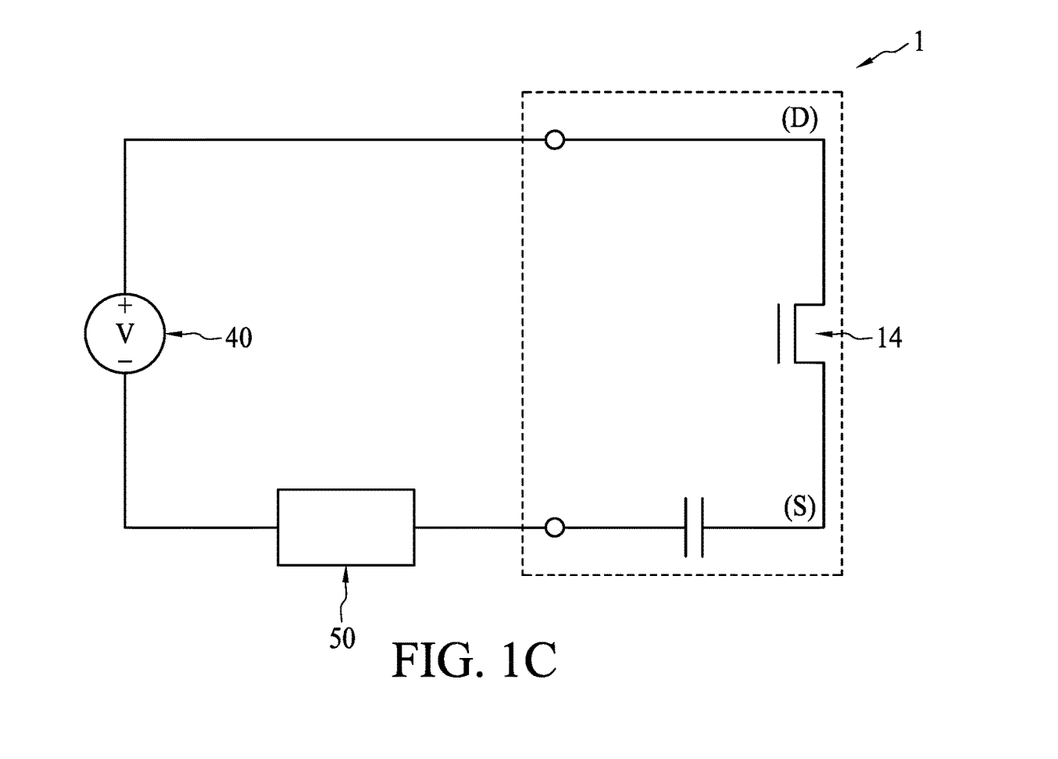

FIG. 1C illustrates, in schematic circuit diagram form, an exemplary crack detecting circuit in accordance with another embodiment. In the embodiment, the capacitor structure of the semiconductor device 1 is formed in the source side and the method of detecting cracks is the same as that illustrated in FIG. 1B.

Figure 2A:
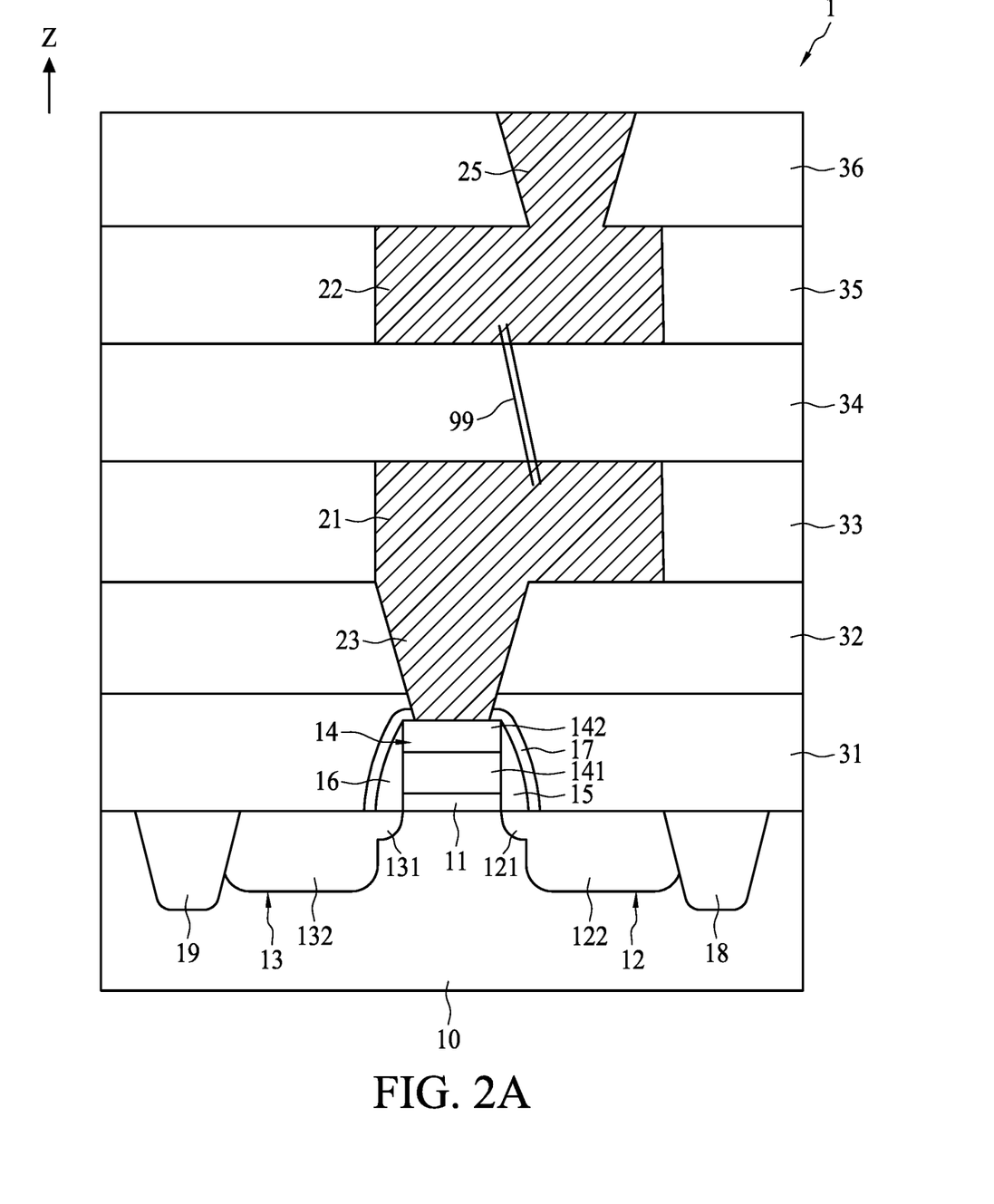
FIG. 2A and FIG. 2B illustrate, in schematic cross-sectional view and circuit diagram form, a semiconductor device in accordance with an embodiment of the present disclosure.

FIG. 2A is a cross-sectional view of an embodiment of the present disclosure, in which the capacitor structure is coupled to the control structure 20 of the semiconductor device 1.

In this embodiment, the conductive layer 21 is at the same level as the isolation layer 33 and is enclosed by the isolation layer 33. The conductive layer 21 is electrically coupled to the metal layer 142 of the control structure 14 by the connecting plug 23. The connecting plug 23 penetrates the isolation layers 31, 32 and the mask layer 17 and electrically connects the metal layer 142 to the conductive layer 21. The conductive layer 22 is at the same level as the isolation layer 35 and is enclosed by the isolation layer 35. The conductive layer 22 is opposite to the conductive layer 21 with the isolation layer 34 interposed therebetween. The terminal 25 is formed to pass through the seal layer 36 and is electrically connected to the conductive layer 22. Two terminals (not shown) are electrically coupled to the doped regions 12, 13 and can be connected to an external circuit. Alternatively, in other embodiments, the isolation layer 34 can be formed of dielectric material such as silicon-oxy-nitride, barium strontium titanate, lead zirconium titanate, titanium oxide, aluminum oxide, hafnium oxide, or zirconium oxide, for example. The capacitor structure having the isolation layer 34 formed of the aforementioned dielectric material may have a high capacitance.

Figure 2B:
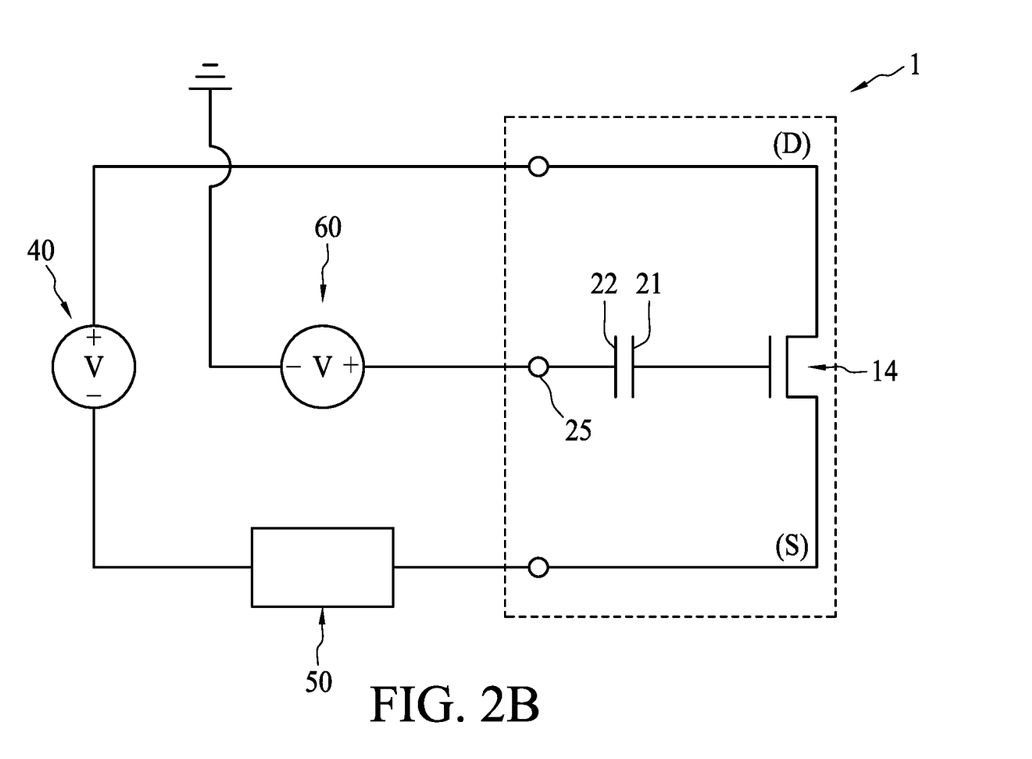

FIG. 2B illustrates, in schematic circuit diagram form, an exemplary crack detecting circuit in accordance with the variation embodiment depicted. The voltage source 40 and the signal detector 50 of the test circuitry are electrically connected to the semiconductor device 1 through the terminals connected to the doped regions 12, 13. The voltage source 60 of the control circuitry is electrically connected to the terminal 25 of the semiconductor device 1.

When the provided gate voltage of the voltage source 60 is positive and the predetermined voltage of the voltage source 40 is applied, if there is a crack 99 present in the semiconductor device 1, the capacitor structure in the semiconductor device 1 will form a leakage current due to the presence of the crack 99, and the n-type MOSFET will be in On mode. Hence, the leakage current can be measured by the signal detector 50. In contrast, if no crack is present in the semiconductor device 1, the n-type MOSFET will be in Off mode due to the resistance of the capacitor structure of the semiconductor device 1. Accordingly, no current is measured by the signal detector 50. In another embodiment, for example, the voltage source 40 of the test circuitry and the voltage source 60 of the control circuitry may be the same voltage source.

Figure 3:
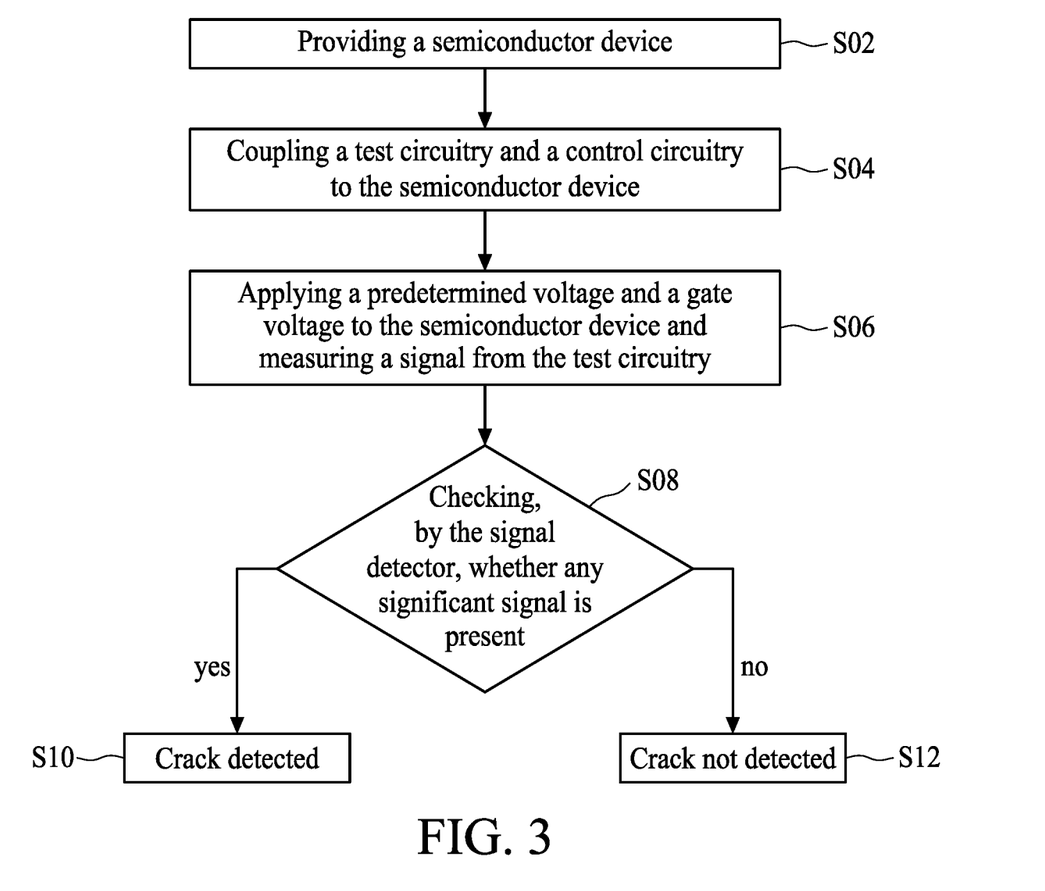
FIG. 3 illustrates, in flowchart diagram form, a method for detecting cracks in accordance with an embodiment of the present disclosure.

FIG. 3 illustrates, in flowchart diagram form, an exemplary method for detecting cracks in accordance with an embodiment of the present disclosure.

In step S02, a semiconductor device is provided. The semiconductor device includes a first conductive layer, a second conductive layer disposed above the first conductive layer and at least partially overlapping the first conductive layer, an isolation layer disposed between the first conductive layer and the second conductive layer, and a transistor electrically coupled to the first conductive layer. The first conductive layer, the second conductive layer, and the isolation layer together form a capacitor structure. Specifically, a drain of the transistor is electrically coupled to the first conductive layer.

Alternatively, in another embodiment, a gate of the transistor is electrically coupled to the first conductive layer.

In step S04, a test circuitry and a control circuitry are coupled to the semiconductor device. The test circuitry includes a first voltage source and a signal detector. The signal detector is, for example, a current detector. The first voltage source and signal detector are electrically connected. Specifically, the first voltage source is electrically coupled to the second conductive layer of the semiconductor device. The signal detector is electrically coupled to a source of the transistor of the semiconductor device. The control circuitry includes a second voltage source. The second voltage source is electrically coupled to a gate of the transistor. The first conductive layer is electrically coupled to a drain of the transistor.

Alternatively, in another embodiment, the first voltage source is electrically coupled to a drain of the transistor. The signal detector is electrically coupled to a source of the transistor. The second voltage source is electrically coupled to the second conductive layer of the semiconductor device. The first conductive layer is electrically coupled to a gate of the transistor.

In step S06, a predetermined voltage and a gate voltage are applied to the semiconductor device and measure a signal from the test circuitry. The predetermined voltage and the gate voltage are both positive and less than a breakdown voltage of the capacitor structure of the semiconductor device. The predetermined voltage is provided by the first voltage source of the test circuitry. The gate voltage is provided by the second voltage source of the control circuitry. The signal can be read from the signal detector of the test circuitry.

In step S08, a significant signal, if any is present, is detected by the signal detector of the test circuitry. If any crack is present in the semiconductor device, in step S10, a leakage current is detected due to the presence of cracks. In contrast, if no current is measured by the signal detector, the lack of current indicates that a resistance of the capacitor structure of the semiconductor device is obstructing the conducting of the test circuitry. That is, in step S12, it is determined that no crack is present in the semiconductor device.

The semiconductor device according to the present disclosure makes it possible to electrically and efficiently test for cracks, due to the capability for conducting testing. In addition, the semiconductor device according to the present disclosure makes it possible to electrically detect latent damages, which are difficult to be detected by visual inspection.

The semiconductor device according to the present disclosure makes it possible to perform semiconductor device sorting with more consistency, more certainty, and greater ease.

Furthermore, the semiconductor device according to the present disclosure makes it possible to eliminate the visual inspection process. As a result, it is possible to reduce the number of inspectors and shorten the inspection process, thus greatly reducing cost.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor device, comprising:
   a first conductive layer;
   a second conductive layer positioned above the first conductive layer;
   an isolation layer positioned between the first conductive layer and the second conductive layer;
   a transistor electrically coupled to the first conductive layer; and
   a first voltage source, a second voltage source, and a signal detector; wherein the first voltage is electrically and respectively coupled to the signal detector and a drain of the transistor, the signal detector is electrically coupled to a source of the transistor, and the second voltage is electrically coupled to a gate of the transistor;
   wherein the first conductive layer, the second conductive layer, the isolation layer, and the transistor together form a crack detecting structure.

2. The semiconductor device of claim 1, wherein the first conductive layer and the second conductive layer at least partially overlap.

3. The semiconductor device of claim 1, wherein the first conductive layer is electrically coupled to a drain of the transistor.

4. The semiconductor device of claim 1, wherein the first conductive layer is electrically coupled to a gate of the transistor.

5. The semiconductor device of claim 2, wherein the first conductive layer is electrically coupled to a drain of the transistor.

6. The semiconductor device of claim 2, wherein the first conductive layer is electrically coupled to a gate of the transistor.

7. A semiconductor device, comprising:
   a substrate;
   an insulating layer positioned above the substrate, wherein the insulating layer has two ends;
   a first doped region formed in the substrate and positioned at one end of the two ends of the insulating layer;
   a second doped region formed in the substrate and positioned at the other end of the two ends of the insulating layer, wherein the second doped region is opposite to the first doped region;
   a control structure positioned above the insulating layer;
   a first conductive layer positioned above the control structure and electrically coupled to the first doped region;
   a second conductive layer positioned above the first conductive layer; and
   an isolation layer positioned between the first conductive layer and the second conductive layer.

8. The semiconductor device of claim 7, wherein the first conductive layer and the second conductive layer at least partially overlap.

9. The semiconductor device of claim 7, wherein the control structure comprises a doped layer and a metal layer, the doped layer is positioned on the insulating layer, and the metal layer is positioned on the doped layer.

10. The semiconductor device of claim 8, wherein the control structure comprises a doped layer and a metal layer, the doped layer is positioned on the insulating layer, and the metal layer is positioned on the doped layer.

11. The semiconductor device of claim 7, further comprising a first voltage source, a second voltage source, and a signal detector; wherein the first voltage source is electrically and respectively coupled to the signal detector and the second conductive layer, the signal detector is electrically coupled to the second doped region, and the second voltage source is electrically coupled to the control structure.

12. A semiconductor device, comprising:
   a substrate;
   an insulating layer positioned above the substrate, wherein the insulating layer has two ends;
   a first doped region formed in the substrate and positioned at one end of the two ends of the insulating layer;
   a second doped region formed in the substrate and positioned at the other end of the two ends of the insulating layer, wherein the second doped region is opposite to the first doped region;
   a control structure positioned above the insulating layer;
   a first conductive layer positioned above the control structure and electrically coupled to the control structure;
   a second conductive layer positioned above the first conductive layer; and
   an isolation layer positioned between the first conductive layer and the second conductive layer.

13. The semiconductor device of claim 12, wherein the first conductive layer and the second conductive layer at least partially overlap.

14. The semiconductor device of claim 12, wherein the control structure comprises a doped layer and a metal layer, the doped layer is positioned on the insulating layer, and the metal layer is positioned on the doped layer.

15. The semiconductor device of claim 13, wherein the control structure comprises a doped layer and a metal layer, the doped layer is positioned on the insulating layer, and the metal layer is positioned on the doped layer.

16. The semiconductor device of claim 12, further comprising a first voltage source, a second voltage source, and a signal detector; wherein the first voltage source is electrically and respectively coupled to the signal detector and the first doped region, the signal detector is electrically coupled to the second doped region, and the second voltage source is electrically coupled to the second conductive layer.

17. A method for detecting cracks comprising:
   providing a semiconductor device, the semiconductor device comprising:
      a first conductive layer;
      a second conductive layer positioned above the first conductive layer;
      an isolation layer positioned between the first conductive layer and the second conductive layer; and
      a transistor electrically coupled to the first conductive layer;
   wherein the first conductive layer, the second conductive layer, the isolation layer, and the transistor together form a crack detecting structure;
   coupling a test circuitry and a control circuitry to the semiconductor device;

applying a predetermined voltage from the test circuitry and a gate voltage from the control circuitry to the semiconductor device and measuring a signal from the test circuitry;

wherein the test circuitry comprises a first voltage source and a signal detector and the control circuitry comprises a second voltage source, the first voltage source is electrically and respectively coupled to the signal detector and the second conductive layer, the signal detector is electrically coupled to a source of the transistor, the second voltage source is electrically coupled to a gate of the transistor, and the first conductive layer is electrically coupled to a drain of the transistor.

18. A method for detecting cracks, comprising:

providing a semiconductor device, the semiconductor device comprising:

a first conductive layer;

a second conductive layer positioned above the first conductive layer;

an isolation layer positioned between the first conductive layer and the second conductive layer; and a transistor electrically coupled to the first conductive layer;

wherein the first conductive layer, the second conductive layer, the isolation layer, and the transistor together form a crack detecting structure;

coupling a test circuitry and a control circuitry to the semiconductor device; applying a predetermined voltage from the test circuitry and a gate voltage from the control circuitry to the semiconductor device and measuring a signal from the test circuitry;

wherein the test circuitry comprises a first voltage source and a signal detector and the control circuitry comprises a second voltage source, the first voltage source is electrically and respectively coupled to the signal detector and a drain of the transistor, the signal detector is electrically coupled to a source of the transistor, the second voltage source is electrically coupled to the second conductive layer, and the first conductive layer is electrically coupled to a gate of the transistor.

\* \* \* \* \*